United States Patent
Mori et al.

(10) Patent No.: US 7,834,323 B2
(45) Date of Patent: Nov. 16, 2010

(54) RADIATION IMAGING DEVICE

(75) Inventors: Harumichi Mori, Hamamatsu (JP);
Masahiko Honda, Hamamatsu (JP);
Ryuji Kyushima, Hamamatsu (JP);
Kazuki Fujita, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 10 days.

(21) Appl. No.: 11/596,071

(22) PCT Filed: May 10, 2005

(86) PCT No.: PCT/JP2005/008530

§ 371 (c)(1),
(2), (4) Date: Dec. 10, 2007

(87) PCT Pub. No.: WO2005/109037

PCT Pub. Date: Nov. 17, 2005

(65) Prior Publication Data

US 2008/0192891 A1    Aug. 14, 2008

(30) Foreign Application Priority Data

May 11, 2004    (JP)    ............................... 2004-141546

(51) Int. Cl.
*G01T 1/20* (2006.01)

(52) U.S. Cl. ................................................. 250/370.11

(58) Field of Classification Search ............ 250/370.11, 250/370.1; 378/62
See application file for complete search history.

(56) References Cited

U.S. PATENT DOCUMENTS

| | | | | |
|---|---|---|---|---|
| 5,198,379 A | * | 3/1993 | Adan | ......................... 438/151 |
| 5,381,013 A | * | 1/1995 | Cox et al. | .............. 250/370.09 |
| 5,464,984 A | * | 11/1995 | Cox et al. | .............. 250/370.11 |
| 5,886,353 A | * | 3/1999 | Spivey et al. | .......... 250/370.09 |
| 6,175,611 B1 | * | 1/2001 | Melen et al. | ................... 378/19 |
| 6,207,944 B1 | | 3/2001 | Spartiotis et al. | |
| 6,323,490 B1 | * | 11/2001 | Ikeda et al. | ............. 250/370.09 |
| 6,479,827 B1 | | 11/2002 | Hamamoto et al. | |
| 6,800,836 B2 | * | 10/2004 | Hamamoto et al. | ...... 250/208.1 |

(Continued)

FOREIGN PATENT DOCUMENTS

JP    9-153606    6/1997

(Continued)

*Primary Examiner*—David P Porta
*Assistant Examiner*—Djura Malevic
(74) *Attorney, Agent, or Firm*—Drinker Biddle & Reath LLP

(57) ABSTRACT

Wiring substrates 11 and 12 are positioned on a fixed base 10 in a manner such that there is a step between the wiring substrates, and radiation imaging elements 2 and 3, respectively having scintillators 25 and 35 deposited on photosensitive portions 21 and 31, are respectively mounted on the wiring substrates 11 and 12. The radiation imaging element 2 is positioned so that its setting surface protrudes beyond a radiation incident surface of the radiation imaging element 3, and the photosensitive portion 21 of the radiation imaging element 2 and the photosensitive portion 31 of the radiation imaging element 3 are juxtaposed to a degree to which the portions do not overlap. The photosensitive portion 21 of the radiation imaging element 2 extends close to an edge at the radiation imaging element 3 side and the scintillator 25 of substantially uniform thickness is formed up to this position.

4 Claims, 14 Drawing Sheets

U.S. PATENT DOCUMENTS

| | | |
|---|---|---|
| 6,800,857 B2 | 10/2004 | Kajiwara et al. |
| 6,879,344 B1 * | 4/2005 | Nakamura et al. .......... 348/362 |
| 7,019,303 B2 | 3/2006 | Homme et al. |
| 7,050,538 B2 | 5/2006 | Tashiro et al. |
| 7,247,858 B2 | 7/2007 | De Keyser |
| 7,420,185 B2 | 9/2008 | Tazaki |
| 2002/0006236 A1 | 1/2002 | Schulman |
| 2002/0012057 A1 * | 1/2002 | Kimura ....................... 348/308 |
| 2003/0042425 A1 | 3/2003 | Tashiro et al. |
| 2003/0116715 A1 * | 6/2003 | Homme et al. ......... 250/370.11 |
| 2003/0155516 A1 | 8/2003 | Spartiotis et al. |
| 2003/0156677 A1 * | 8/2003 | Francke ........................ 378/1 |
| 2003/0160188 A1 | 8/2003 | Tazaki |
| 2003/0173493 A1 | 9/2003 | Homme et al. |
| 2004/0089813 A1 | 5/2004 | Takabayashi et al. |
| 2004/0195514 A1 * | 10/2004 | Nagano ................. 250/370.11 |
| 2004/0200971 A1 | 10/2004 | De Keyser |
| 2004/0247069 A1 * | 12/2004 | Arai et al. ...................... 378/4 |
| 2005/0023438 A1 * | 2/2005 | Hamamoto et al. ...... 250/208.1 |
| 2005/0167604 A1 | 8/2005 | Suganuma et al. |
| 2007/0069111 A1 * | 3/2007 | Spahn .................... 250/208.1 |

FOREIGN PATENT DOCUMENTS

| | | |
|---|---|---|
| JP | 10-135479 | 5/1998 |
| JP | 2000-292546 | 10/2000 |
| JP | 2002-164523 | 6/2002 |
| JP | 2002164523 A * | 6/2002 |
| JP | 2002-526751 | 8/2002 |

\* cited by examiner

RADIATION IMAGING DEVICE

TECHNICAL FIELD

The present invention relates to a radiation imaging device and particularly relates to a large-scale radiation imaging device for use in such applications as mammography.

BACKGROUND ART

In the field of X-ray photography for medical and industrial purposes, radiation imaging systems using radiation detecting elements in place of X-ray sensitive films are coming to be used widely in recent years. Such a radiation imaging system is highly convenient in that there is no need for development as in the case of X-ray sensitive films and radiation images can be checked in real time, etc., and also provides advantages in terms of data storability and ease of handling.

With a general radiation imaging system, an incident radiation image is converted to visible light, etc. (including ultraviolet rays and infrared rays) by a scintillator, and the converted light image is detected by photodetecting elements arrayed in one dimension or two dimensions and output electrical signals corresponding to image data. In particular, radiation detecting elements of a structure, in which a scintillator is directly deposited onto a photodetecting surface of a solid-state imaging element, provide a merit of being easy to handle.

A solid-state imaging element becomes lower in manufacturing yield as its screen size becomes larger. There is thus a limit to making each individual imaging element large in screen size. Meanwhile, with radiation, because, unlike with visible light, etc., an image cannot be reduced by an optical system, an imaging element of a size that covers real images is required. For example, among chest X-ray photography devices, mammography devices for breast cancer screening, panorama photography devices for jaw portions, etc., there is known an art, in which a large-screen imaging element is formed from a buttable array of small imaging elements aligned in a tile-like manner (see, for example, Patent Document 1).

There is also known an art for reducing dead areas at boundary portions between respective imaging elements in a buttable array by shifting a plurality of detectors to the front and rear as viewed from a direction of incidence of radiation so that imaging regions of the detectors overlap (see, for example, Patent Document 2).

Patent Document 1: Japanese Published Unexamined Patent Application No. H9-153606
Patent Document 2: Japanese Published Unexamined Patent Application No. 2000-292546

DISCLOSURE OF THE INVENTION

Problem to be Solved by the Invention

As indicated in the Patent Document 2, when imaging elements are arranged in a buttable array, the forming of dead areas at the mutual boundary portions of the imaging elements becomes a problem. Though with the art of the Patent Document 2, the dead areas are reduced by positioning the imaging elements so that the imaging regions overlap, at portions that are blocked by imaging elements positioned in front as viewed from the radiation incident direction, the radiation is attenuated by a substrate, etc. Especially, with radiation imaging devices for medical use, equipment that enable measurements to be made at high sensitivity and high definition while reducing the radiation amount to reduce the exposure dose of subjects and operators are being demanded, and such attenuation is not preferable in that it degrades the definition of the images obtained.

An object of the present invention is thus to provide a buttable array radiation imaging device, with which a large-screen radiation image can be acquired at high sensitivity and high definition even with a low radiation amount.

Means for Solving the Problem

To achieve the above object, the present invention provides in a radiation imaging device, having m×n (m being an integer no less than 2 and n being an integer no less than 1) radiation imaging elements arrayed on a base, each radiation imaging element being formed by depositing a scintillator on a photodetecting surface of a solid-state imaging element, the solid-state imaging element having a photodetecting portion formed by arraying pixels in two dimensions, the scintillator emitting light including light of a wavelength to which the solid-state imaging element has sensitivity upon incidence of radiation, the scintillator covered with a protective film, wherein with any two adjacently positioned radiation imaging elements, (1) a surface fixed to the base of one of the radiation imaging elements protrudes more in a radiation incident direction than a radiation incident surface of the other radiation imaging element, (2) wherein the two radiation imaging elements are juxtaposed to each other in a state such that the photodetecting portion of the radiation imaging element positioned at the back as viewed from the radiation incident direction is not blocked by the radiation imaging element positioned at the front, and (3) wherein the photodetecting portion of the radiation imaging element positioned at the front spreads to an edge at the side of the radiation imaging element positioned at the back and has the scintillator formed at substantially the same thickness from a central portion of the photodetecting portion to the edge.

With the present invention, the photodetecting portions of the radiation imaging elements that are positioned adjacently on the base are juxtaposed to each other. Here, because the photodetecting portion of the radiation imaging element positioned at the back as viewed from the radiation incident direction is not blocked by the radiation imaging element positioned at the front, the entire surface of each photodetecting portion is an effective imaging region, even with the radiation imaging element positioned at the back. Also, with the radiation imaging element positioned at the front, because the photodetecting portion spreads to the edge at the side close to the radiation imaging element positioned at the back, the boundary of the photodetecting region is enlarged to the side close to the radiation imaging element positioned at the back. And by the scintillator being formed at uniform thickness up to the edge, the effective image region of the radiation imaging element positioned at the front is enlarged and imaging characteristics within the region are made uniform.

Preferably, with any two adjacently positioned radiation imaging elements, an end of the imaging element positioned at the back as viewed from the radiation incident direction and an end of the imaging element positioned at the front as viewed from the radiation incident direction are positioned so that the ends overlap. The photodetecting portions are thereby juxtaposed to each other as viewed from the radiation incident direction.

Preferably, with any two adjacently positioned radiation imaging elements, the radiation imaging element positioned at the back as viewed from the radiation incident direction has the scintillator deposited at portions more outward than an end of the photodetecting portion at the end blocked by the radiation imaging element positioned at the front, the scintillator being formed at uniform thickness up to this end of the photodetecting portion.

With the radiation imaging element positioned at the back, a portion besides the photodetecting portion may be present at positions blocked by the radiation imaging element positioned at the front. A circuit or a holding portion may be formed at outer sides of the photodetecting portion. If the scintillator is formed at a uniform thickness up to the end of the photodetecting portion, the imaging characteristics can be readily made uniform for the photodetecting portion as a whole.

Effect of the Invention

With the present invention, because the photodetecting portions of the respective radiation imaging elements can be juxtaposed to each other without restricting the effective image regions, the imaging characteristics within the effective image regions can be made uniform while suppressing the forming of dead areas. Thus, when a plurality of the imaging elements are combined in a buttable array to form a large-screen imaging element, the occurrence of unevenness of image and focus deviation due to the imaging elements being different can be restrained, and images can be obtained at high sensitivity and high definition even with a low radiation amount.

When the photodetecting portions are positioned so that the ends overlap as viewed from the radiation incident direction, the dead area can be lessened because the photodetecting portions can be positioned closer to each other.

Unlike the radiation imaging elements positioned at the front, with the radiation imaging elements positioned at the back, the photodetecting portions do not need to be positioned close to the edges. By disposing the photodetecting portion near the center of the substrate, the forming of a scintillator that is uniform in thickness up to the ends of the photodetecting portion is facilitated and the product yield is improved further. Especially, when radiation imaging elements of two different sizes are positioned adjacently, by positioning the larger radiation imaging element at the back, the scintillator with uniform thickness up to the ends of the photodetecting portion can be formed readily and the product yield is improved further.

DESCRIPTION OF SYMBOLS

Figure 1:
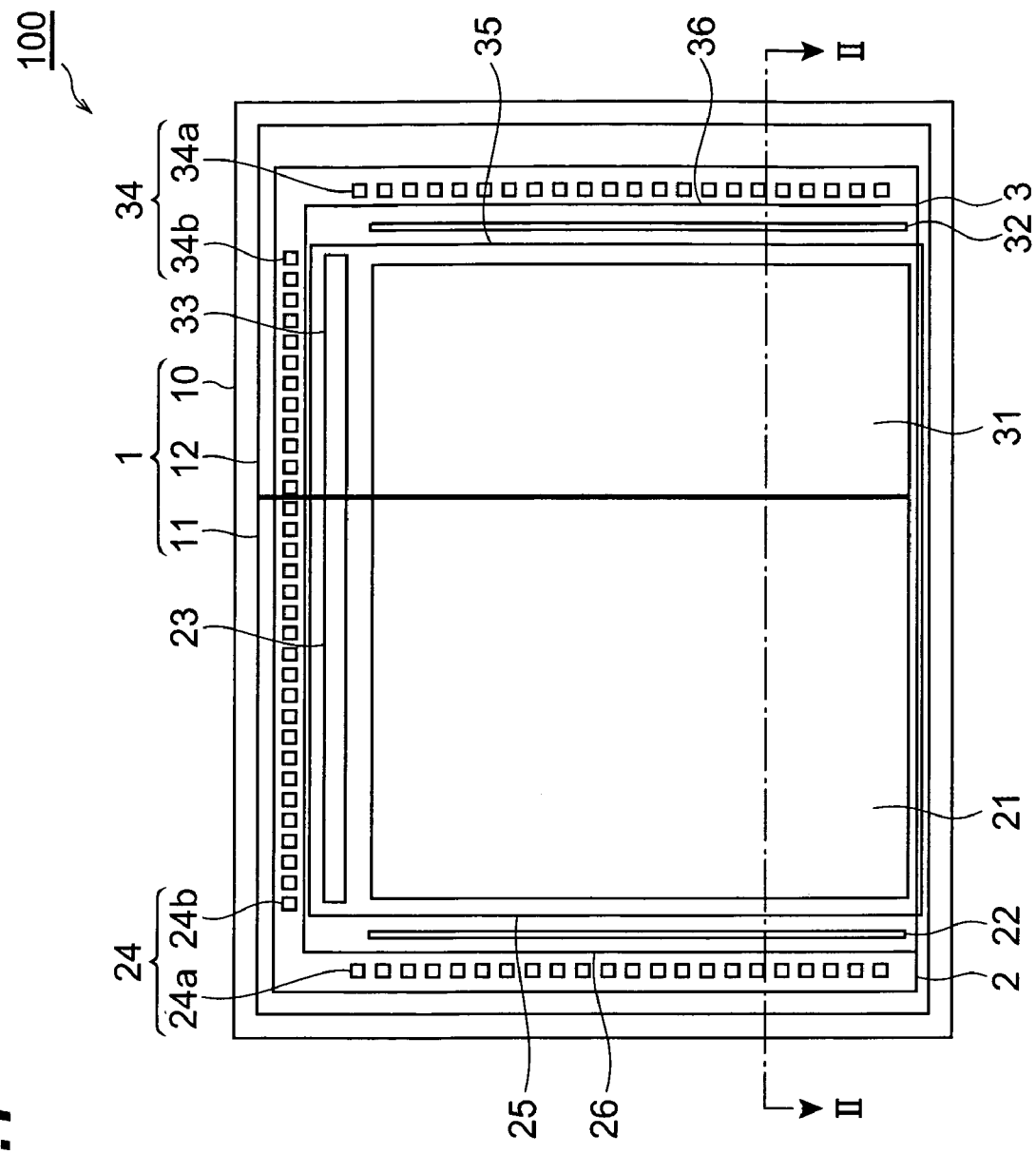
FIG. 1 is a front view of a radiation imaging device according to the present invention as viewed from a radiation incident direction.

1: Base
2, 3, 3a: Radiation imaging element
5: Image sensor
6: Setting device
9: Subject
10: Fixed base
10a, 10b: Setting surface
11, 12: Wiring substrate
20, 30: Si substrate
21, 31: Photosensitive portion
22, 32: Shift register portion
23, 33: Amplifying portion
24, 34: Bonding pad portion
25, 35: Scintillator
26, 36: Protective film
60: Upper space
61: Lower space
62: Vacuum pump
70, 71: Plate
75: Radiation source
90: Breast
100: Radiation imaging device
111, 121: Penetrating hole
112, 122: Adhesive material

BEST MODES FOR CARRYING OUT THE INVENTION

Preferred embodiments of the present invention shall now be described in detail with reference to the attached drawings. To facilitate the understanding of the description, components that are the same in the respective drawings shall be provided, as much as possible, with the same symbols and overlapping description shall be omitted.

Figure 2:
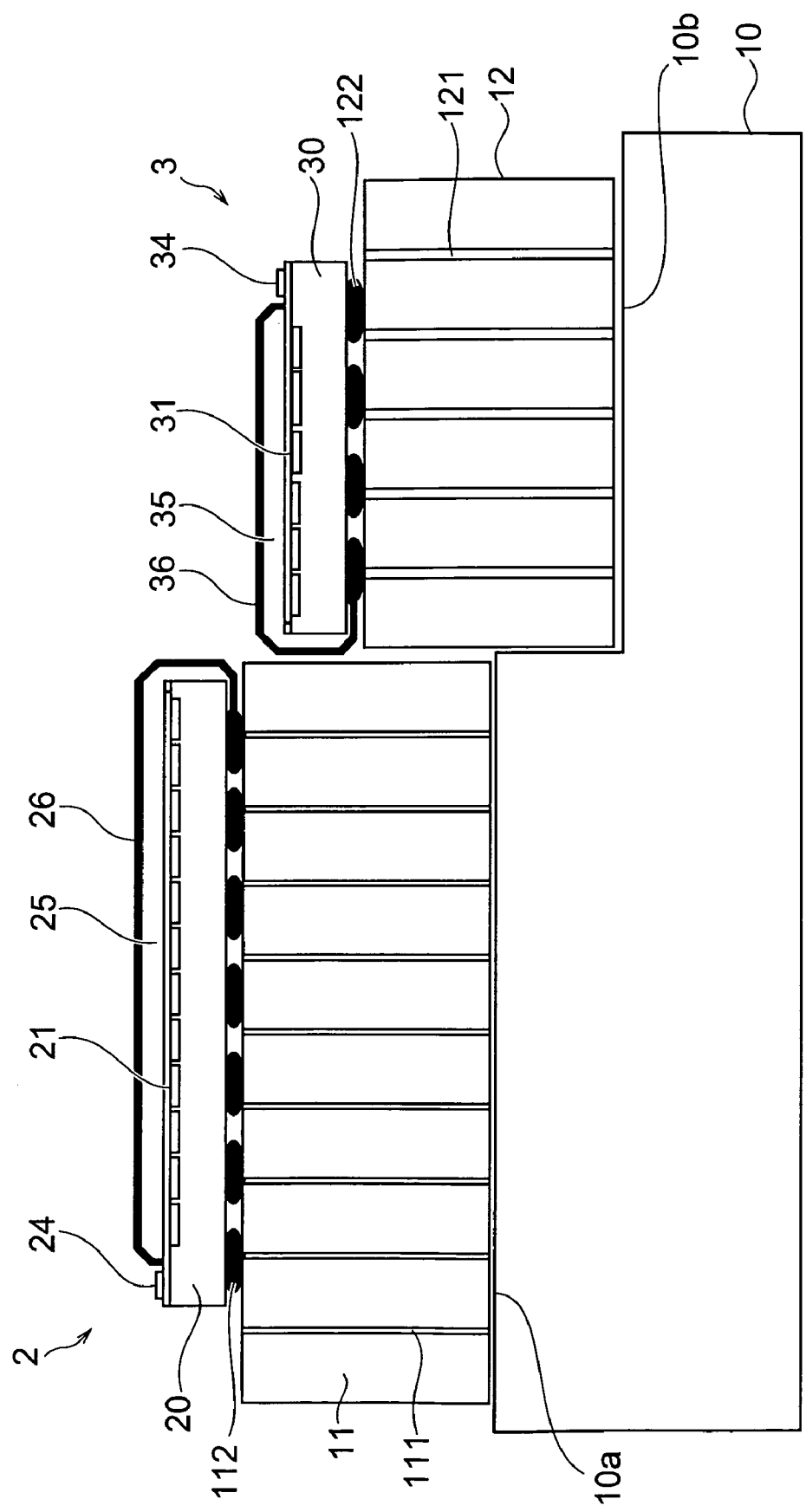
FIG. 2 is a sectional view taken along line II-II of FIG. 1.
Figure 3:
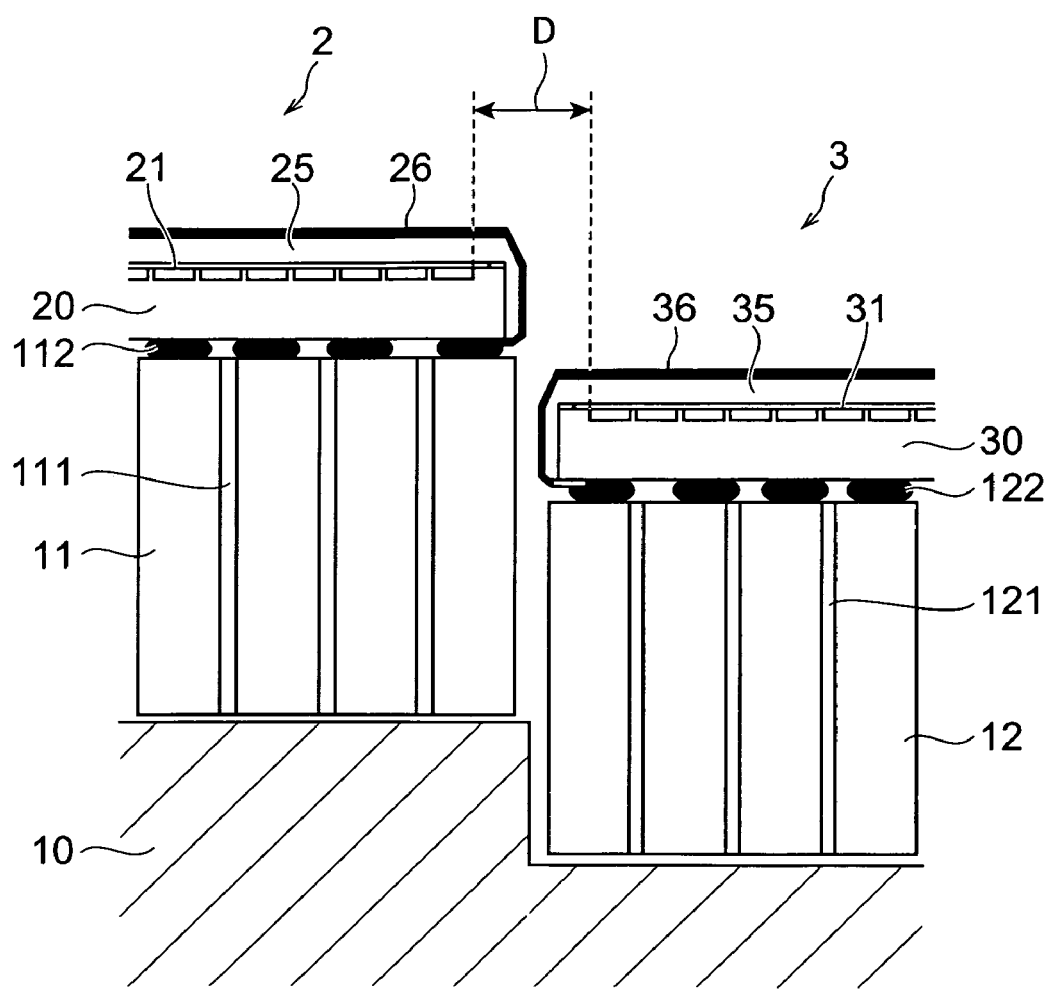
FIG. 3 is an enlarged view of a boundary portion of radiation imaging elements of FIG. 2.

A first embodiment of a radiation imaging device according to the present invention is shown in FIGS. 1 to 3. FIG. 1 is a front view as viewed from a radiation incident direction. FIG. 2 is a sectional view taken along line II-II of FIG. 1. FIG. 3 is an enlarged view of a boundary portion of radiation imaging elements of FIG. 2.

As shown in FIGS. 1 to 3, with the radiation imaging device 100, radiation imaging elements 2 and 3 are positioned in a stepped manner on a base 1. The radiation imaging elements 2 and 3 are MOS (Metal-Oxide Semiconductor) type image sensors formed on Si substrates 20 and 30, respectively, and are formed to rectangular plate-like shapes. Here, the Si substrate 20 has a size of 184 mm×231 mm, the Si substrate 30 has a size of 96 mm×231 mm, and both have a thickness of 725 μm.

Each of photosensitive portions (photodetecting portions) 21 and 31, which are photodetecting regions, is positioned up to vicinities of two adjacent edges of each of the top surfaces of the Si substrates 20 and 30. In FIG. 1, these two edges are the edge positioned at the side at which the other radiation imaging element 2 or 3 is positioned and the edge positioned at the lower side in the figure. With each of the photosensitive portions 21 and 31, a plurality of photodiodes, which are photoelectric converting elements that perform photoelectric conversion, are arrayed in two dimensions and form pixels. For each photodiode, a corresponding MOSFET (Field-Effect Transistor) is positioned, which controls the reading of charges generated at the photodiode. The photosensitive portion 21 has a size of 179.4 mm×209 mm (area: approximately 37500 mm$^2$) and has 3520×4416 pixels (total of approximately 15.50 million pixels). In other words, the photosensitive portion 31 has a size of approximately half of 82.8 mm×209 mm (area: approximately 17300 mm$^2$) and has 1760×4416 pixels (total of approximately 7.80 million pixels).

At regions along two outer edges of each of the photosensitive portions 21 and 31 of the Si substrates 20 and 30 are respectively formed shift register portion 22 and 32 and amplifying portions 23 and 33. Bonding pad portions 24 and 34 are formed at outer sides of these components.

The shift register portions 22 and 32 are respectively electrically connected by unillustrated wirings to the corresponding MOSFETs inside the photosensitive portions 21 and 31 and control the driving of the MOSFETs to transfer the charges generated at the photodiodes to the amplifying portions 23 and 33.

Each of the amplifying portions 23 and 33 is formed of a plurality of amplifiers (charge amplifiers), capacitive elements that are connected in parallel to the respective amplifiers, and switching elements that are connected in parallel to these components, etc. Each amplifier of the amplifying portions 23 and 33 is electrically connected by an unillustrated wiring to a corresponding photodiode via a MOSFET.

The bonding pad portions 24 and 34 have bonding pad portions 24a and 34a that are respectively connected by unillustrated wirings to the shift register portions 22 and 32, and bonding pad portions 24b and 34b that are respectively connected by unillustrated wirings to the amplifying portions 23 and 33.

Forming of the electrodes and wirings at the edges of the chip provides the effect of preventing microcracks formed by dicing and electron-hole pairs generated at such microcracks from reaching the photosensitive portions 21 and 31.

Scintillators 25 and 35, which generate light including light of a predetermined wavelength upon incidence of radiation, are formed on the top surfaces of the photosensitive portions 21 and 31 and the surrounding Si substrates 20 and 30. Here, the scintillators 25 and 35 are formed continuously to side wall portions of the Si substrates 20 and 30 at which the photosensitive portions 21 and 31 are juxtaposed to each other. The scintillators 25 and 35 may be formed so as to cover the shift register portions 22 and 32 and the amplifying portions 23 and 33. The top surfaces of the shift register portions 22 and 32 and the amplifying portions 23 and 33 are preferably covered with light shielding members and radiation shielding members. When these top surfaces are covered with the scintillators 25 and 35, radiation shielding members are not needed. Radiation that is made directly incident onto the shift register portions 22 and 32 and the amplifying portions 23 and 33 may be a cause of noise or a cause of erroneous operation, and by covering with the scintillators 25 and 35 that absorb radiation, the occurrence of such noise and erroneous operation can be suppressed. Because the bonding pad portions 24 and 34 need to be exposed, the scintillators 25 and 35 are formed so as not to reach these regions.

It is sufficient that the light generated by the scintillators 25 and 35 include light of a wavelength to which the photodiodes of the photosensitive portions 21 and 31 have sensitivity, and besides visible light, the light may be ultraviolet rays or infrared rays. Though various materials can be used in the scintillators 25 and 35, Tl-doped CsI, which is high in emission efficiency, is preferable as the material. The scintillators 25 and 35 are directly formed as columnar crystals on the top surfaces of the photosensitive portions 21 and 31 by vapor deposition.

On the photosensitive portions 21 and 31, the scintillators 25 and 35 are formed to a substantially uniform thickness up to the ends of these portions. The scintillators 25 and 35 are preferably made approximately 30 to 550 μm in thickness. In the present embodiment, the thickness of the scintillators 25 and 35 is set to 165 μm.

Protective films 26 and 36 are formed so as to respectively seal the scintillators 25 and 35 by covering the surfaces thereof. CsI, which is used as the scintillators 25 and 35, has a deliquescent property of absorbing water vapor (moisture) in air and becoming dissolved thereby. The scintillators 25 and 35 are covered with protective moisture resistant films of good water vapor blocking property (water impermeability) to prevent the entry of water vapor. As the protective films 26 and 36, an organic film, inorganic film, or a combination of these of good water vapor blocking property can be used and, for example, a polyparaxylylene resin (trade name: Parylene, made by Three Bond Co., Ltd.) or a polyparachloroxylylene (trade name: Parylene C, made by the same), which is a type of polyparaxylylene resin, is preferably used.

The protective films 26 and 36 are respectively formed continuously and integrally from the scintillators 25 and 35 on the photodetecting surfaces of the Si substrates 20 and 30 to the boundary regions of the bonding pad portions 24 and 34 and the scintillators 25 and 35 at the periphery and to rear surfaces (the surfaces at the opposite side of the surface on which the photosensitive portions 21 and 31 are formed) of the Si substrates 20 and 30 beyond the side wall portions at which the scintillators 25 and 35 are formed. The protective films 26 and 36 are preferably several μm to ten and several μm in thickness, and in the present embodiment, the thickness is set to 10 μm.

Meanwhile, the base 1 has a fixed base 10, an upper surface of which is formed to a stepped form, and wiring substrates 11 and 12, which are respectively fixed to setting surfaces 10a and 10b of the fixed base 10 and on which the respective radiation imaging elements 2 and 3 are fixed.

The fixed base 10 is made, for example, of ceramic, is 372×245 mm in size, is 5 mm in thickness at the position of setting surface 10a, and is 4 mm in thickness at the position of setting surface 10, with the step height between 10a and 10b being 1 mm. The setting surfaces 10a and 10b are both formed to be slightly wider than the wiring substrates 11 and 12 to be described below.

The wiring substrates 11 and 12 are also ceramic substrates and the sizes thereof are set to be slightly wider than the corresponding radiation imaging elements 2 and 3, and, for example, the wiring substrate 11 is 226×248 mm in size and the wiring substrate 12 is 138×248 mm in size. Both substrates are set to 3.2 mm in thickness.

A plurality of penetrating holes 111 and 121 that pass through from top surfaces to rear surfaces are formed in the wiring substrates 11 and 12 (see FIGS. 2 and 3). As viewed from the top surfaces or the rear surfaces, these penetrating holes 111 and 121 are positioned at intersections of lattice lines that are drawn at equal intervals. The interval between adjacent penetrating holes 111 and 121 shall be expressed by a pitch p. Though it is sufficient that these penetrating holes 111 and 121 be provided at just the regions on which the radiation imaging elements 2 and 3 are set, the holes may be provided over the entire surfaces beyond the setting regions. The positions and size of the penetrating holes 111 and 121 are set appropriately in consideration of the strength and thickness of the wiring substrates 11 and 12 and ventilating properties of the penetrating holes 111 and 121. In the present embodiment, the penetrating holes 111 and 121 are made approximately 0.4 mm to 0.5 mm in diameter and the pitch p thereof is set to 20 mm.

Figure 4:
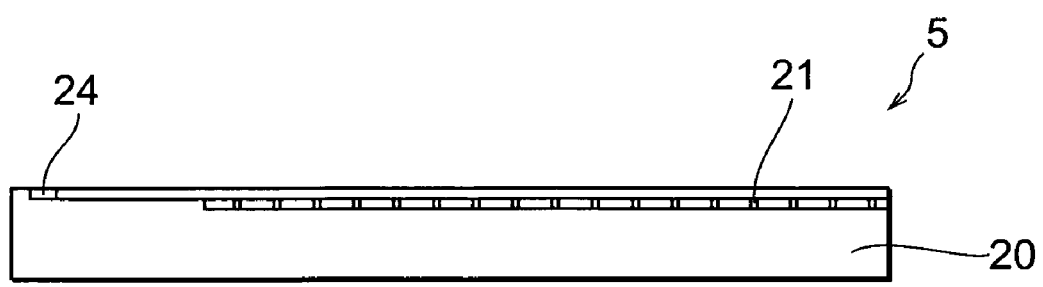
FIG. 4 is a diagram of a process of manufacturing a radiation imaging element used in the radiation imaging device according to the present invention.

A method for manufacturing this radiation imaging device 100 shall now be described specifically. First, as shown in FIG. 4, an image sensor 5 which has the rectangular Si substrate 20 on which the photosensitive portion 21, the shift register portion 22 (not shown), the amplifying portion 23 (not shown), and the bonding pad portions 24 have been formed, is prepared. Here, the photosensitive region 21 is positioned not at a center of the Si substrate 20 but closer to the adjacent two edges. The image sensor 5 can be manufactured, for example, by forming an integrated circuit by a known means using a stepper device, etc., on an Si wafer of a diameter of 12 inches (approximately 30 centimeters) and thereafter cutting to a desired size.

Then, in a state in which a mask is applied so that a region wider than the photosensitive portion 21 is exposed, the Si substrate 20 is placed inside a scintillator vapor deposition chamber and the scintillator 25 is formed. Here, the side wall portions of the Si substrate 20 juxtaposed to the photosensitive portion 21 are also exposed from the mask. As the mask, a vapor deposition holder, which uses portions along the two edges of the photosensitive portion 21 and rear surfaces of these portions to hold the Si substrate 20 upside down, can be used.

Figure 5:
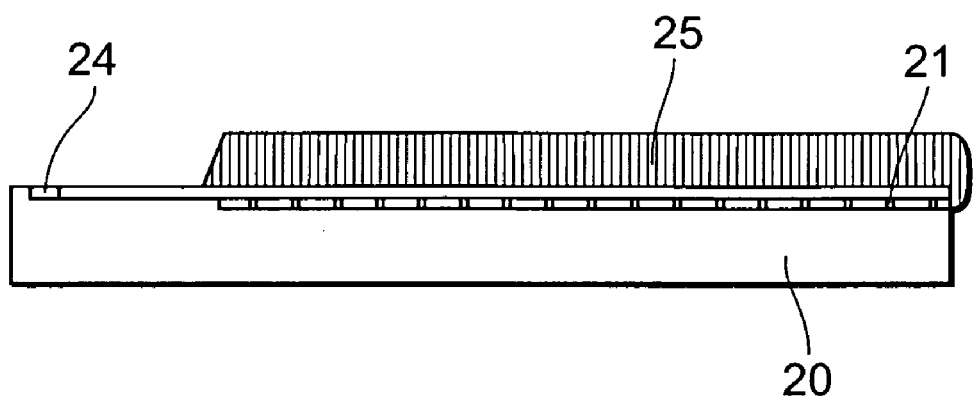
FIG. 5 is a diagram of a continuation of the process of FIG. 4.

In this state, columnar crystals of Tl-doped CsI are grown on the exposed portions of the Si substrate 20 by the vacuum deposition method. When the thickness of the vapor-deposited scintillator 25 reaches the desired thickness (for example, 165 μm), the image sensor 5 (see FIG. 5), on which the scintillator 25 is formed, is taken out from the vapor deposition chamber. The scintillator 25 having a substantially uniform thickness from the entire surface of the photosensitive portion 21 to the adjacent side wall portions, can thus be formed.

CsI, which is the material of the scintillator 25, is high in moisture absorbing property and when left exposed, absorbs and becomes dissolved by the water vapor in air (has a deliquescent property). Thus, to protect the scintillator 25, the protective film 26 is formed by covering substantially the entirety of the image sensor 5 by Parylene of 10 μm thickness by a CVD (chemical vapor deposition) method.

Though there are gaps between the columnar crystals of CsI, Parylene enters into these narrow gaps to some degree so that the protective film 26 closely contacts the scintillator 25 and seals the scintillator 25. By this Parylene coating, a precision thin film coating of uniform thickness can be formed on the scintillator 25 that has a finely uneven top surface. Also, in comparison to metal vapor deposition, the CVD formation of Parylene can be accomplished at a lower degree of vacuum and at room temperature, and the processing is thus easy.

Figure 6:
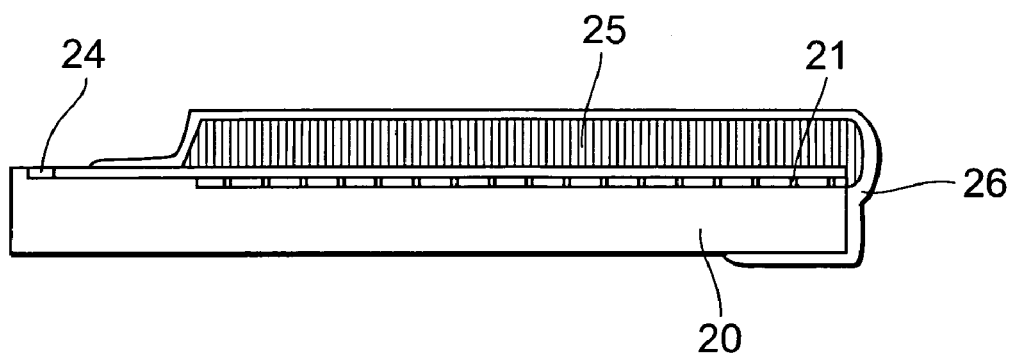
FIG. 6 is a diagram of a continuation of the process of FIG. 5.

By cutting the formed protective film 26 at predetermined positions and removing unnecessary portions, the bonding pad portions 24 are exposed (see FIG. 6). Though in the present embodiment, the protective film 26 is left only in a region that surrounds the scintillator 25, the protective film 26 may be left over a wider region instead. For example, just the bonding pad portions 24a and 24b may be exposed and a region besides these may be left covered with the protective film 26.

The radiation imaging element 2 shown in FIGS. 1 to 3 is thus obtained. The radiation imaging element 3 can also be manufactured by the same method.

Figure 7:
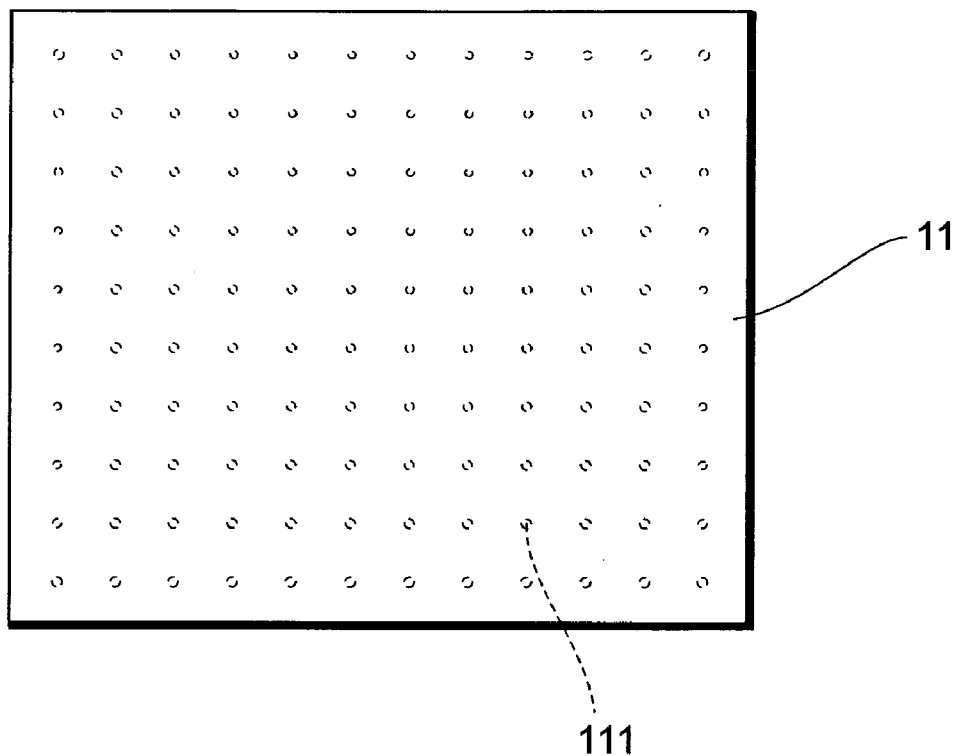
FIG. 7 is a diagram of a wiring substrate used in the radiation imaging device according to the present invention.

The wiring substrate 11 having the penetrating holes 111 is then prepared as shown in FIG. 7, and an insulating resin adhesive material 112 is then coated in a lattice-like manner on the setting surface of the radiation imaging element 2 of the wiring substrate 11. In this process, the adhesive material 112 is coated so as to avoid the penetrating holes 111 and positioned at substantially central positions between the penetrating holes 111 that are adjacent in horizontal directions. Specifically, the adhesive material 112 is coated so as to extend along lattice lines that are shifted by 0.5 p from lattice lines, along which the penetrating holes 111 are positioned, in the two directions that are the extension directions of the lattice lines. In the present embodiment, the adhesive material 112 is made to have a width of 1 mm and a thickness of approximately 0.5 mm.

Figure 8:
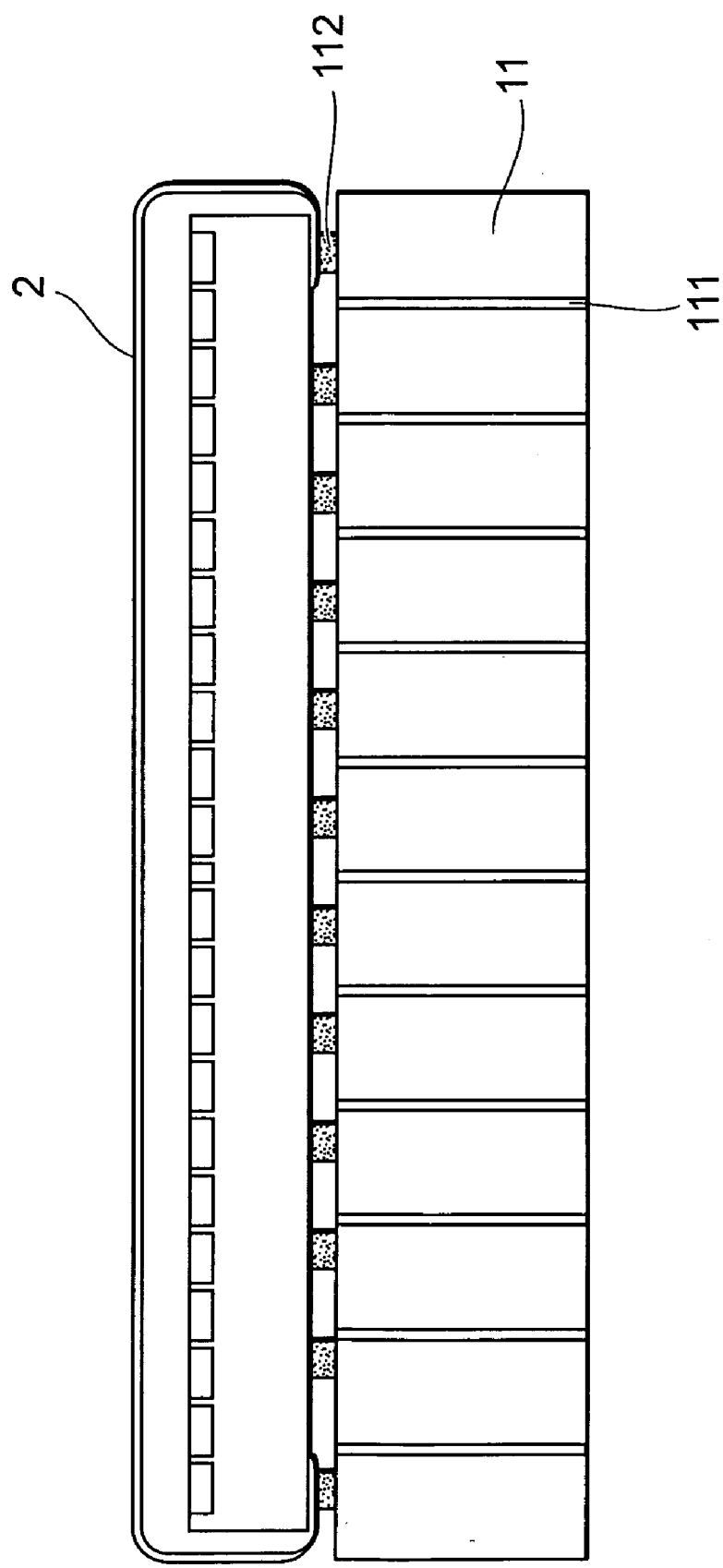
FIG. 8 is a diagram of a continuation of the process of FIG. 6.
Figure 9:
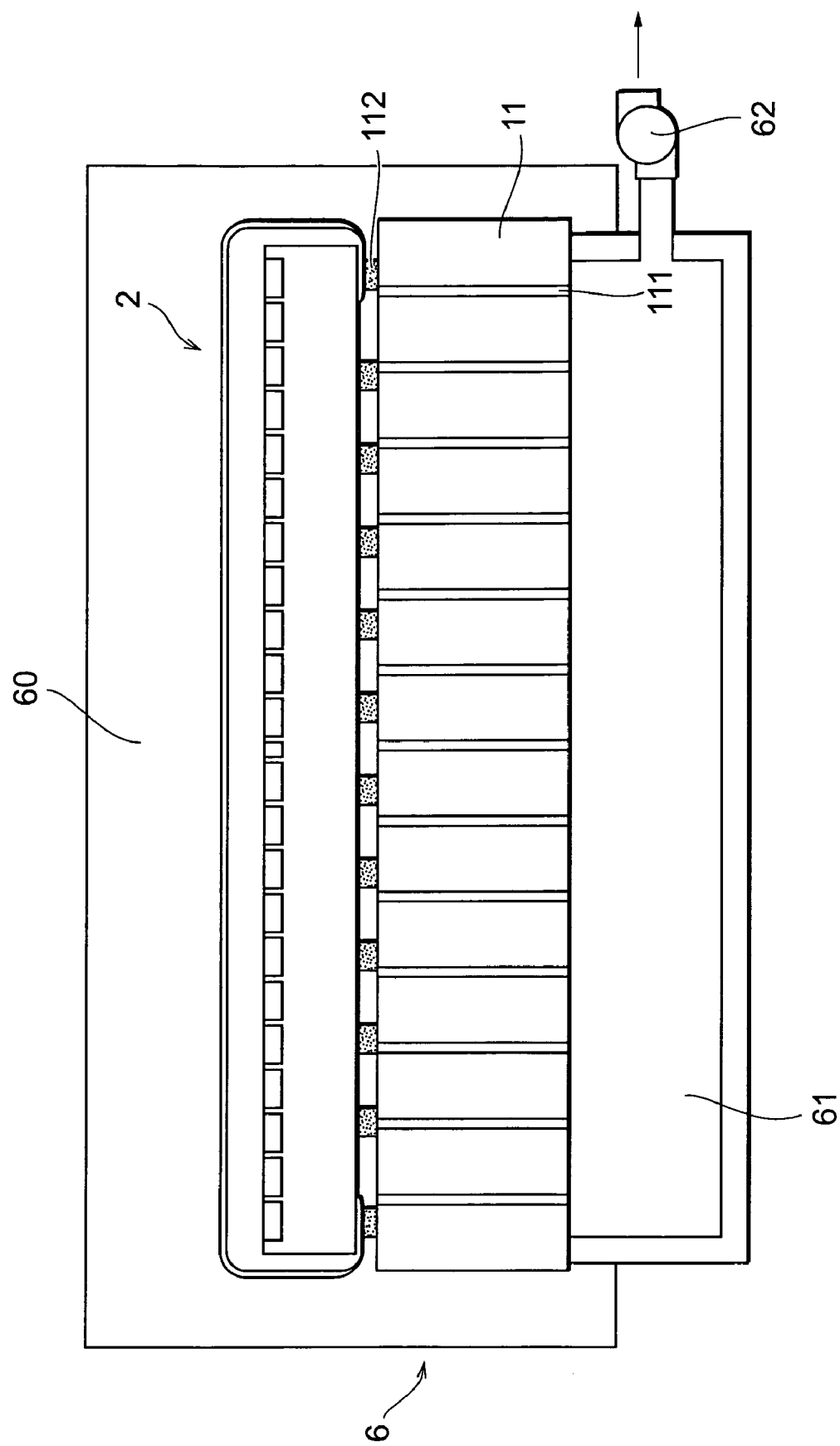
FIG. 9 is a diagram for describing a device used to set the radiation imaging elements.

After the adhesive material 112 has been coated, the rear surface (the surface at the opposite side of the surface on which the photosensitive portion 21 of the Si substrate 20 is formed) of the radiation imaging element 2 is made to face the adhesive material coated surface of the wiring substrate 11 and is set on this surface (see FIG. 8), and the wiring substrate 11 is introduced in this state into a device 6, such as shown in FIG. 9. This device 6 has an arrangement, in which a space 60 that faces the upper side of the introduced wiring substrate 11 and a space 61 that faces the lower side are separated by the wiring substrate 11. A vacuum pump 62 that exhausts the air in the lower space 61 is equipped.

Upon introduction of the wiring substrate 11 into the device 6, the vacuum pump 62 is actuated to depressurize the interior of the lower space 61. Because the penetrating holes 111 of the wiring substrate 11 communicate with the lower space 61, the air pressure at the rear surface side of the radiation imaging element 2 is made lower than the air pressure at the top surface (photosensitive portion 21 formed surface) side by the depressurization. By a pressure difference that thus arises between the top surface side and the rear surface side, the radiation imaging element 2 is pressed against the wiring substrate 11. The adhesive material 112 thus spreads thinly between the radiation imaging element 2 and the wiring substrate 11. The adhesive material 112 is hardened in this state to fix the radiation imaging element 2 to the wiring substrate 11.

After fixing, unillustrated bonding pad portions that are disposed at regions facing the bonding pad portions 24 of the radiation imaging element 2 of the wiring substrate 11 are connected to the corresponding bonding pad portions 24 by likewise unillustrated wires (wire bonding). The same method is employed to fix the radiation imaging element 3 to the wiring substrate 12 by an adhesive material 122.

Because a pressure difference is thus generated between the top surfaces and the rear surfaces of the radiation imaging elements 2 and 3 by use of the penetrating holes 111 and 121 provided in the wiring substrates 11 and 12, and the radiation imaging elements 2 and 3 are thus pressed against and fixed to the wiring substrates 11 and 12 using the generated pressure difference, extra spaces for pressing do not need to be provided on the top surfaces of the radiation imaging elements 2 and 3, and surfaces for forming the scintillators 25 and 35 can be secured maximally on the top surfaces of the radiation imaging elements 2 and 3. The areas of the radiation imaging elements 2 and 3 can thus be made compact with respect to the photosensitive portions 21 and 31, and the radiation imaging device 100 finally obtained can be made compact. Furthermore, because the entire top surfaces of the radiation imaging elements 2 and 3 can be pressed against the wiring substrates 11 and 12 by a substantially uniform force by the pressure difference, the occurrence of deflection, distortion, warping, etc., can be suppressed and planarity of the photodetecting surfaces can be secured even in cases where thin and large-area types of the radiation imaging elements 2 and 3 are to be fixed. Furthermore, because forces are not applied in a localized manner onto the scintillators 25 and 35, the scintillators 25 and 35 are not damaged during the fixing process and the product yield is thus improved.

Because the portions of the protective films 26 and 36 that surround the scintillators 25 and 35 at the side walls wrap around to the rear sides of the radiation imaging elements 2 and 3 and are fixed by being sandwiched by the wiring substrates 11 and 12, the peeling of the protective films 26 and 36 can be prevented effectively. Here, by positioning the radiation imaging elements 2 and 3 slightly inward (by approximately 1 mm) with respect to the wiring substrates 11 and 12 at the locations at which the scintillators 25 and 35 form the lower edges in FIG. 1 upon positioning onto the radiation imaging element 100, among the locations at which the scintillators 25 and 35 of the radiation imaging elements 2 and 3 are formed up to the side walls the application of unwanted force on the protective films 26 and 36 on the side walls during use can be prevented to effectively suppress peeling from this portion.

In a case where the wiring substrates 11 and 12 have penetrating holes 111 and 121 in regions at outer sides of the setting surfaces for the radiation imaging elements 2 and 3, these penetrating holes 111 and 121 must be closed in advance. As a method of closing these penetrating holes 111 and 121, these penetrating holes 111 and 121 may be covered with an airtight film from the setting surface side or covered with an airtight panel or mask, etc., from the opposite side. By doing so, the upper space 60 and the lower space 61 are not put in direct communication by the penetrating holes 111 and 121 and the pressure difference can be generated reliably between the spaces 60 and 61 in the device 6.

Though a pressure difference was generated between the spaces 60 and 61 by depressurizing the lower space 61, another method may be used as long as the air pressure at the top surface side of the radiation imaging elements 2 and 3 becomes higher than the air pressure at the lower side. For example, a pressure difference between the spaces 60 and 61 may be generated by feeding a gas (such as air) into the upper space 60 and pressurizing the gas inside the upper space 60. Furthermore, the two methods may be combined so that the upper space 60 is pressurized and the lower space 61 is depressurized. In this case, the gas inside the lower space 61 may be guided into the upper space 60 and a single pump may be used, to perform pressurization and depressurization. Or, instead of providing both spaces inside the device, just one of either the space 60 or the space 61 for performing pressurization or depressurization may be provided and the other side may be left in an open state. The gas is not restricted to air, and nitrogen, etc., may be used or the device 6 may be placed in a nitrogen box to carry out the process.

After the radiation imaging elements 2 and 3 have thus been fixed respectively onto the wiring substrates 11 and 12, the wiring substrates 11 and 12 are respectively positioned and fixed to the setting surfaces 10a and 10b so that the photosensitive portions 21 and 31 of the radiation imaging elements 2 and 3 are juxtaposed, and the radiation imaging device 100, shown in FIGS. 1 to 3, is thereby obtained.

Here, by positioning the radiation imaging elements 2 and 3 upon providing a step on the base 1, the photosensitive portions 21 and 31 of the radiation imaging elements 2 and 3 can be juxtaposed closer to each other to a degree to which they do not overlap in comparison to the case where the radiation imaging elements 2 and 3 are positioned alongside each other on the same plane. Also, because even when the respective photosensitive portions 21 and 31 are juxtaposed to each other as viewed from the radiation incident direction, the ends of the radiation imaging elements 2 and 3 do not contact each other, damage due to contacting of the scintillators 25 and 35 and the protective films 26 and 36 at the ends can be prevented. Because the peeling of the protective films 26 and 36 due to damage can thus be prevented as well, the moisture resistance of the scintillators 25 and 35 can be secured.

The radiation imaging elements 2 and 3 are positioned at different distances as viewed from the radiation incident direction, and this difference of the distance is approximately 1 to 1.5 mm. With the radiation imaging device 100 with such a large screen, an image, formed by radiation that is made incident substantially perpendicularly from a radiation source at a position approximately 50 centimeters away, is picked up, and the above difference of the distance does not degrade the image that is obtained or the sharpness or the definition. Sharp images of high definition can thus be acquired even with a radiation amount of low exposure dose.

With the present embodiment, because the radiation that is made incident on the scintillator 35 on the photosensitive portion 31 is not blocked even at the radiation imaging element 3 that is positioned at the back in the radiation incident direction, the entire photosensitive portion including the corners thereof can be made an effectively sensitive region. Meanwhile, the effectively sensitive region can also be enlarged up to the very ends of the radiation imaging element 2 positioned at the front in the radiation incident direction. The distance between the adjacently positioned photosensitive portions 21 and 31 can thus be reduced to approximately 150 μm, and a dead area D between the photosensitive portions 21 and 31 of the elements can be reduced to the equivalent of approximately two or three pixels. Also, because the outputs of the pixels juxtaposed to the dead area D are not degraded, image processing can be performed readily to synthesize image signals obtained from the two radiation imaging elements 2 and 3 and thereby provide an image that is sharp up to the boundary portions. Also, in cases where image information of the dead area D is to be determined by an interpolation process, the interpolation process can be performed readily.

By the present invention, an image sensor with a photodetecting area of no more than 22×18 cm size, which is considered to be the maximum size achievable by a manufacturing process using a 12-inch wafer, can be used to realize the radiation imaging device 100 with a photodetecting region of a 27×22 cm size. Reduction of manufacturing cost and improvement of yield can thus be accomplished.

Figure 10:
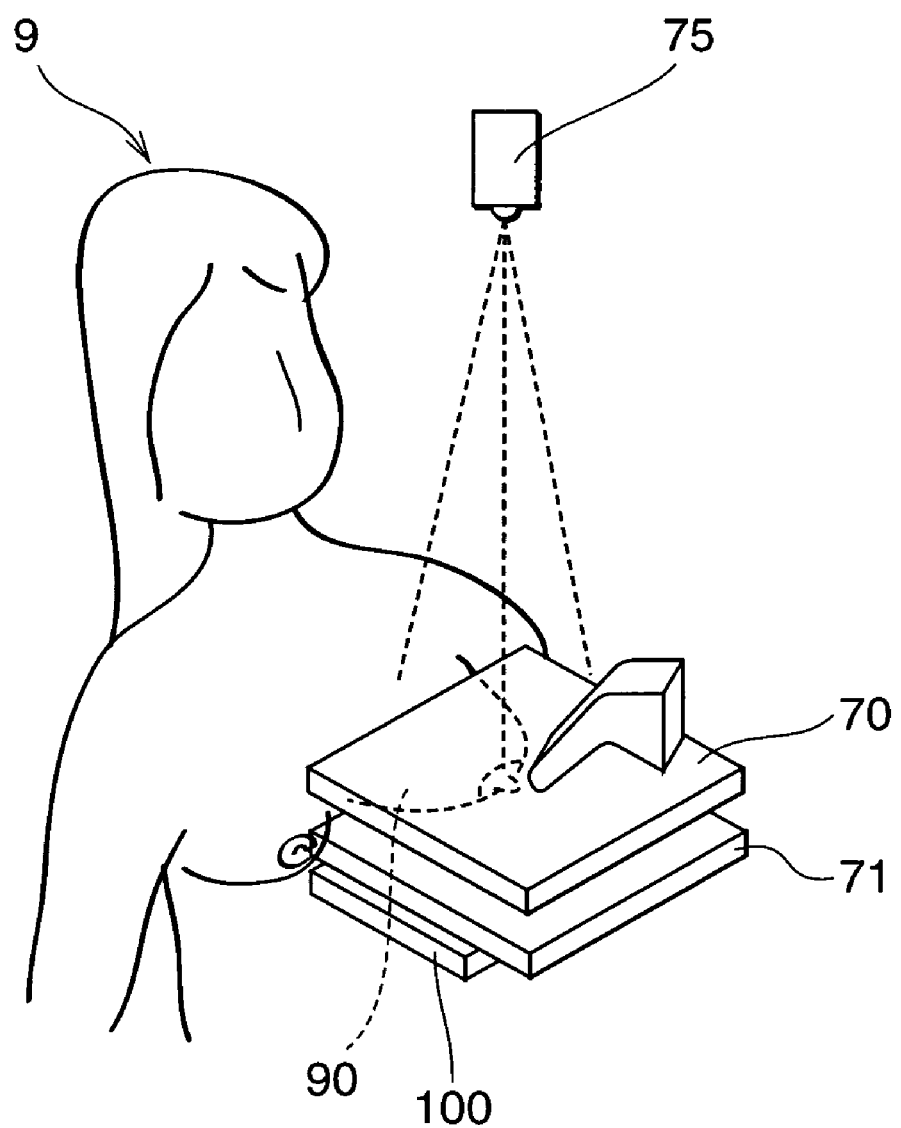
FIG. 10 is a diagram for describing mammography by the radiation imaging device according to the present invention.

Operations of the present embodiment shall now be described. In mammography, a breast 90 of a subject 9 is sandwiched by two radiation transmitting plates 70 and 71, and a breast 90 transmission image of X-rays emitted from a radiation source 75 is picked up by the radiation imaging device 100 positioned at the plate 71 side, as shown in FIG. 10. When in this process, the lower side of the radiation imaging device 100 in FIG. 1 is positioned at the body side of the subject 9, the photosensitive portions 21 and 31 can be juxtaposed to the body.

The X-rays (radiation) that are transmitted through the breast 90 and form the X-ray transmission image of the breast 90 are transmitted through the plate 71 and made incident on the incident surfaces (top surfaces of the protective films 26 and 36) of the radiation imaging device 100. The incident X-rays (radiation) are transmitted through the protective films 26 and 36 and reach and are absorbed by the scintillators 25 and 35. The scintillators 25 and 35 radiate (emit) light of a predetermined wavelength (a wavelength of 570 nm in the present embodiment) substantially proportionally to the amount of the X-rays absorbed.

Light that is thus radiated from the scintillators 25 and 35 reach the photosensitive portions 21 and 31, are absorbed by the respective photodiodes, and are accumulated as charges in accordance with the light amount for a fixed time (photoelectric conversion). Because the light amount of the light corresponds to the amount of the incident X-rays, the electrical signals accumulated in the respective photodiodes are in accordance with the amount of the incident X-rays. Electrical signals (referred to hereinafter as the "image signals of the respective pixels") corresponding to the luminance of the respective pixels of the X-ray image are thus obtained from the respective photodiodes.

By operation of the MOSFETs, corresponding to the respective photodiodes by the shift register portions 22 and 32, the charges (corresponding to the image signals of the respective pixels) of the respective photodiodes are read out via unillustrated signal lines to the charge amplifiers of the amplifying portions 23 and 33 and, after being amplified, are sent from the bonding pad portions 24 and 34 to the corresponding bonding pad portions at the side of the wiring boards 11 and 12 and, after being processed by an unillustrated predetermined circuit, are output as image data signals of a predetermined format from an output terminal. Based on the output signals, an X-ray image can be displayed on a monitor or be stored and saved in a predetermined storage device.

Because with the radiation imaging device 100 according to the present embodiment, the photosensitive portions 21 and 31 are positioned near a peripheral portion of the device, imaging can be performed up to a basal portion of the breast 90. Because the planarity of each of the radiation imaging elements 2 and 3 can be secured and the photosensitive portions 21 and 31 of the respective elements are juxtaposed to each other, a high-precision X-ray image without distortion can be picked up for the entirety of the breast 90. Also, even in mammography of a large woman, an entire radiation image of the breast 90 can be acquired satisfactorily with a single irradiation. The exposure dose can thus be reduced. Also, because the protective films 26 and 36 are formed beyond the side walls that are juxtaposed to the body and are sandwiched between the wiring substrates 11 and 12, the peeling of the protective films 26 and 36 due to contact with a human body and the degradation of the scintillators 25 and 35 due to entry of sweat and moisture from contacting portions can be prevented securely.

Figure 11:
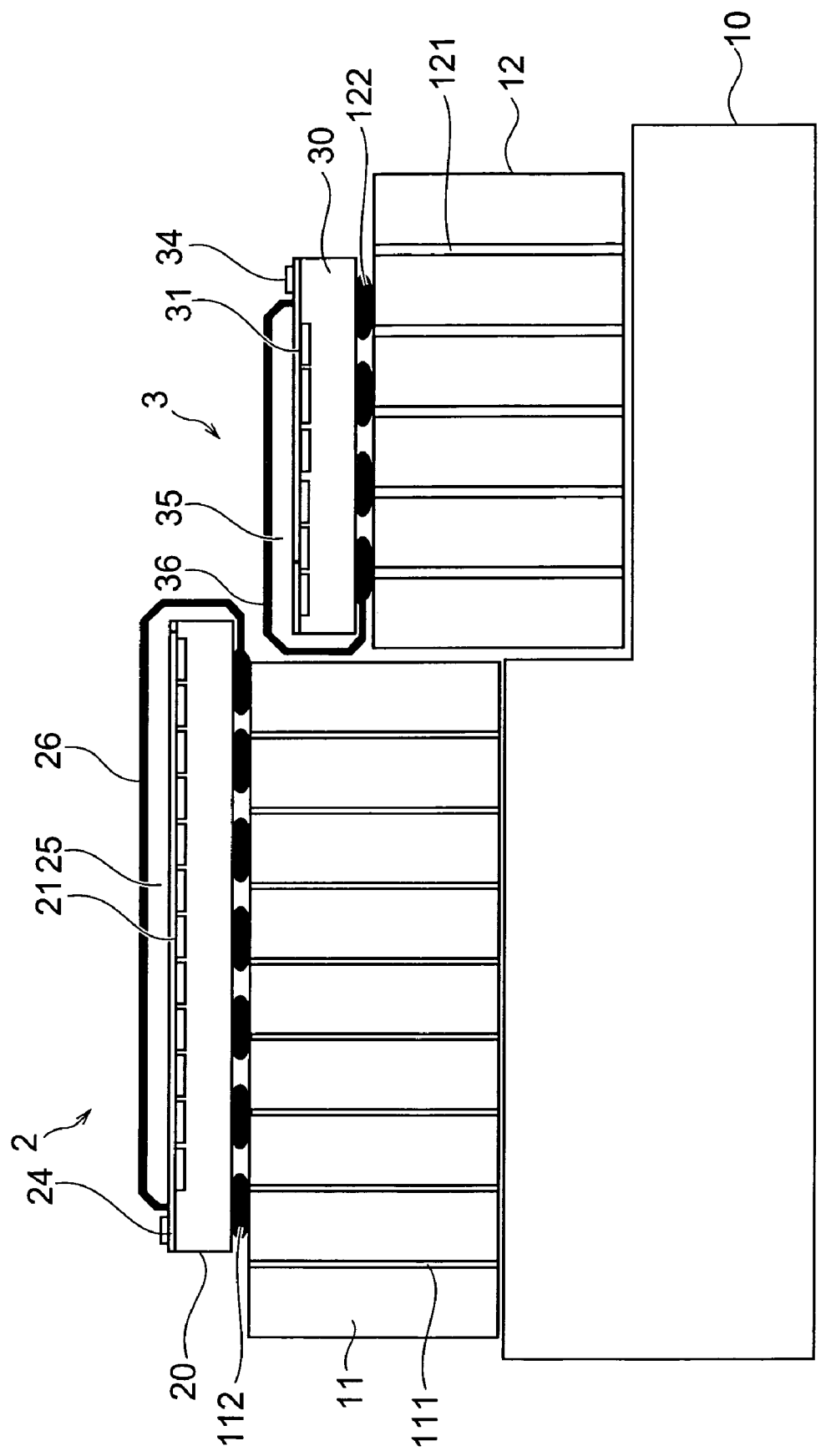
FIG. 11 is a sectional arrangement diagram of a second embodiment of a radiation imaging device according to the present invention.
Figure 12:
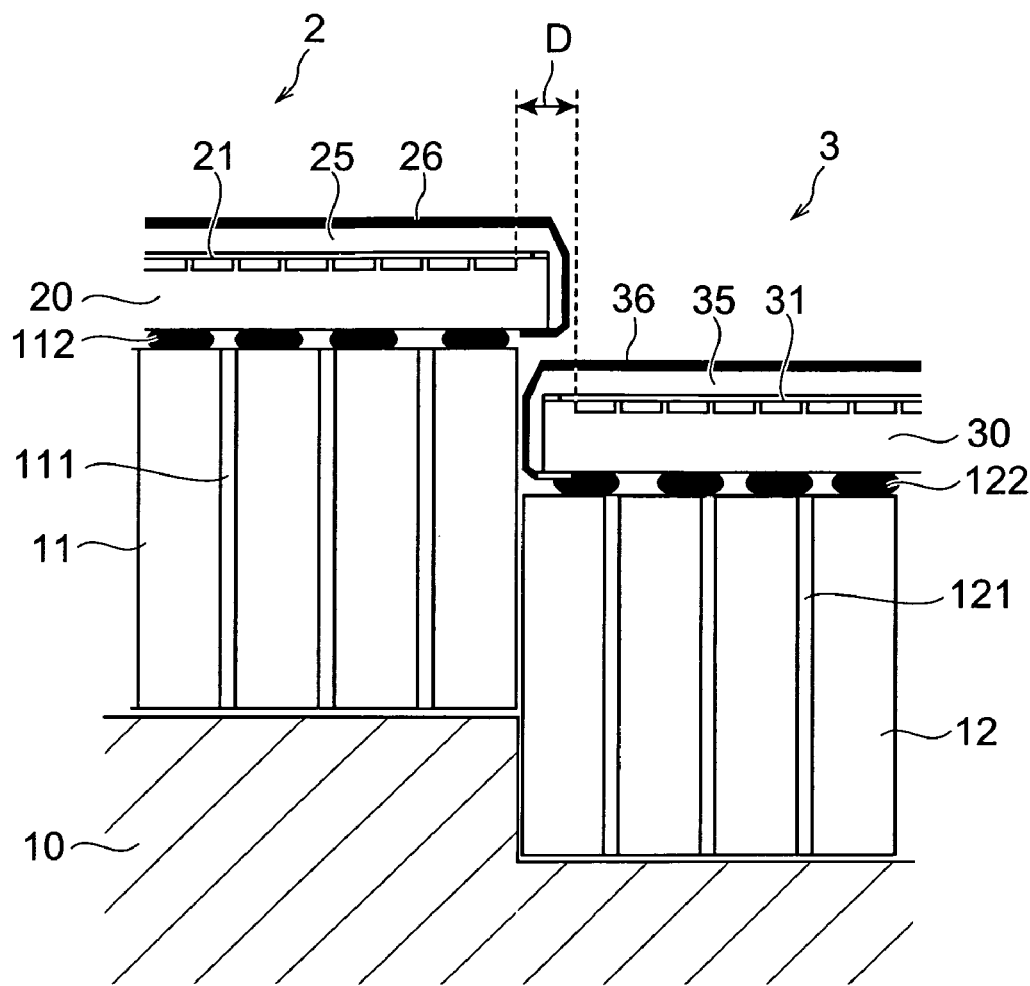
FIG. 12 is an enlarged view of a boundary portion of radiation imaging elements of FIG. 11.

FIG. 11 is a sectional arrangement diagram (corresponding to FIG. 2 for the first embodiment) of a second embodiment of a radiation imaging device according to the present invention. FIG. 12 is an enlarged view of a boundary portion of radiation imaging elements of the device.

This embodiment differs from the first embodiment shown in FIGS. 1 to 3 in that ends of the radiation imaging element 2 and ends of the radiation imaging element 3 overlap as viewed from the radiation incident direction. However, the respective photosensitive portions 21 and 31 do not overlap, and the photosensitive portion 31 of the radiation imaging element 3 at the back is disposed at a position at which it is not blocked by the radiation imaging element 2.

By positioning the two imaging elements thus, the width of the dead area D that arises at the boundary between the photosensitive portions 21 and 31 can be reduced to approximately half that of the first embodiment by the overlapping of the end regions of the two radiation imaging elements 2 and 3. The dead area D between two photosensitive portions can thus be reduced to approximately half or to no more than two pixels and can be reduced to practically zero pixels.

Figure 13:
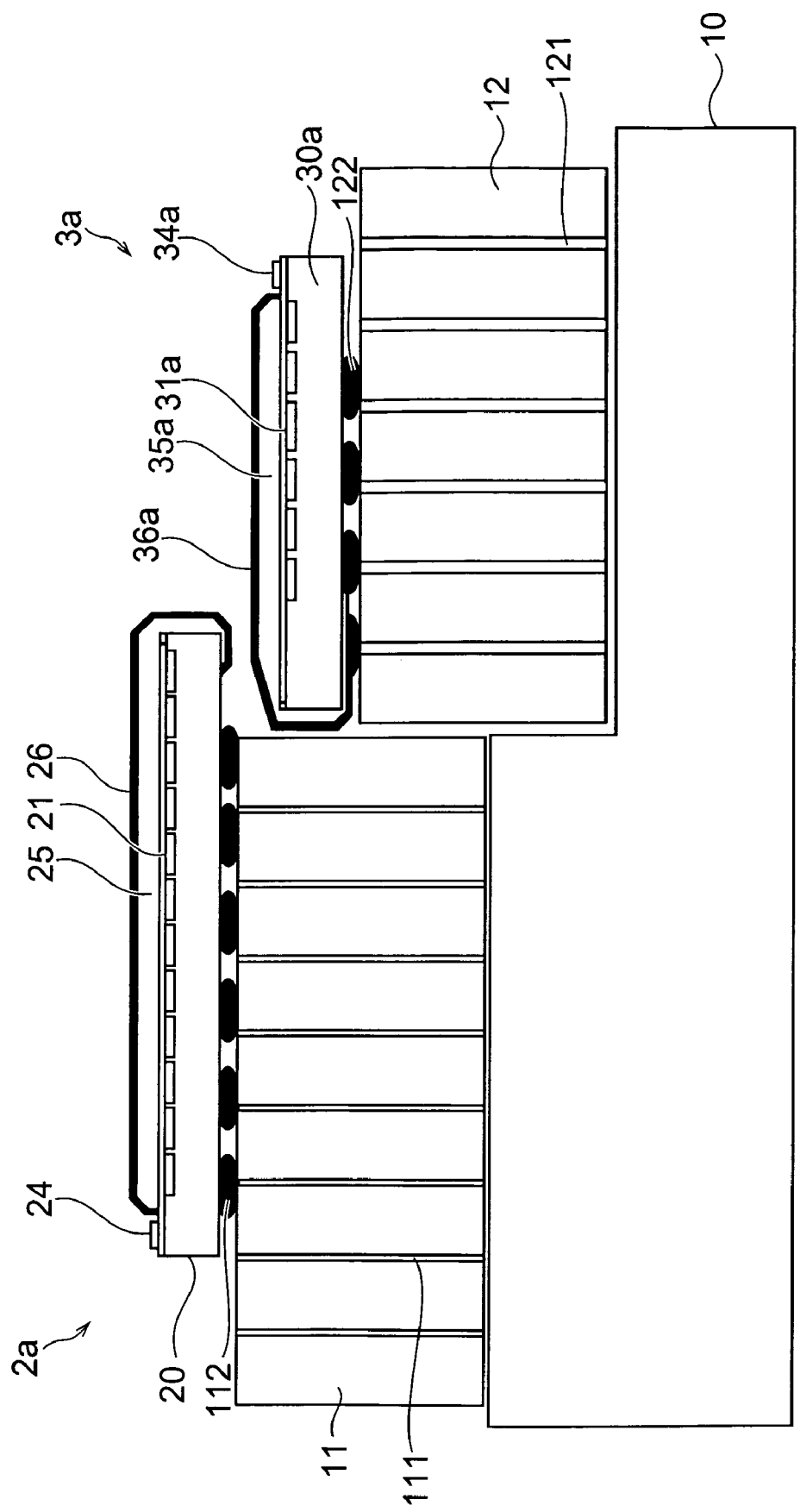
FIG. 13 is a sectional arrangement diagram of a third embodiment of a radiation imaging device according to the present invention.
Figure 14:
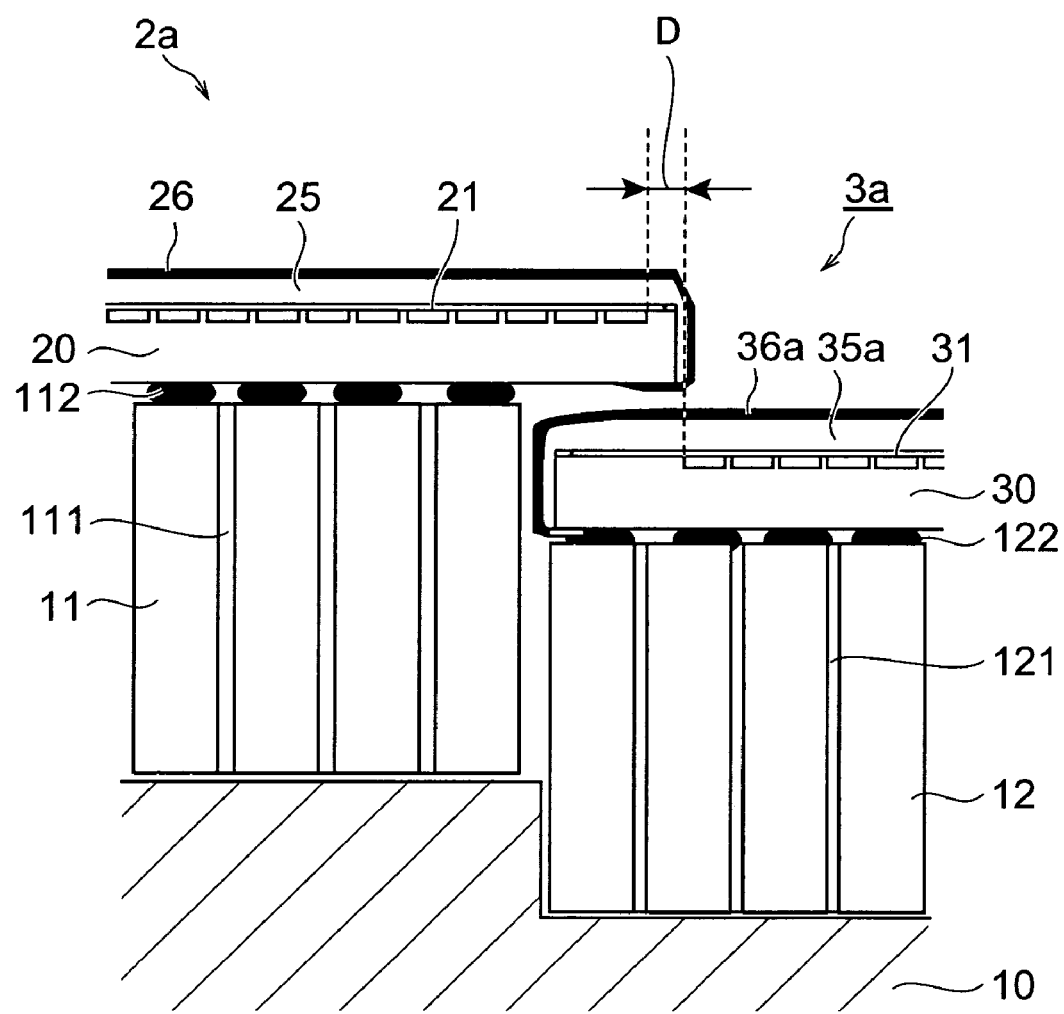
FIG. 14 is an enlarged view of a boundary portion of radiation imaging elements of FIG. 13.

FIG. 13 is a sectional arrangement diagram (corresponding to FIG. 2 for the first embodiment) of a third embodiment of a radiation imaging device according to the present invention. FIG. 14 is an enlarged view of a boundary portion of radiation imaging elements of the device.

This embodiment is a modification example of the second embodiment and differs from the other embodiments in that a photosensitive portion 31a of a radiation imaging element 3a that is disposed at the back does not extend to the edge at the radiation imaging element 2 side and the interval from the photosensitive portion 31a to the end is set wider than that in the other embodiments.

Here, with the radiation imaging element 2 that is positioned at the front, in order to make small the dead area D resulting from the blocking of the other radiation imaging element 3a while securing imaging characteristics up to the end of the effective photodetecting region, the photosensitive portion 21 must be juxtaposed to the edge and the scintillator 25 must be formed at a substantially uniform thickness up to the end. Though for this purpose, it is preferable to form the scintillator 25 continuously at a substantially uniform thickness up to the side wall portion, the scintillator 25 vapor deposition process must be devised accordingly and it takes a lot of trouble required especially when the radiation imaging element 2 is large.

However, because with the radiation imaging element 3a positioned at the back, it suffices to position the photosensitive portion 31a near the radiation imaging element 2 up to the limit at which the photosensitive portion 31a is not blocked by the radiation imaging element 2 disposed at the front (the limit at which two photosensitive portions 21 and 31a do not overlap), a scintillator 35a does not have to be formed at a substantially uniform thickness up to the side wall portion and vapor deposition can be carried out by holding both ends. The process of manufacturing the radiation imaging element 3a positioned at the back can thus be simplified.

Also, in the case where radiation imaging elements that differ in size are to be positioned adjacently, by positioning the larger radiation imaging element at the back side, the scintillator can be formed more readily at a uniform thickness up to the end of the photodetecting portion and the product yield is improved further.

Though in the above description, protective films having a single film structure formed of Parylene were described as the protective films 26 and 36, by providing a reflecting film formed of a metal thin film of Al, Ag, Au, etc., on the top surface of the Parylene film, the light radiated from the scintillators 25 and 35 can be guided to the photosensitive portions 21 and 31 to obtain images of high luminance. For protection of the metal thin film, a Parylene film, etc., may be formed further on the top surface. The peripheries of the protective films 26 and 36 may be fixed by a resin, etc., to the Si substrates 20 and 30.

Also, though CsI (Tl) is used as the scintillators in the above-described embodiments, the present invention is not restricted thereto, and CsI (Na), NaI (Tl), LiI (Eu), KI (Tl), etc., may be used instead.

Also, besides polyparaxylylene, the polyparaxylylene in the above-described embodiments includes polymonochloroparaxylylene, polydichloroparaxylylene, polytetrachloroparaxylylene, polyfluoroparaxylylene, polydimethylparaxylylene, polydiethylparaxylylene, etc.

Though examples of combining and positioning two imaging elements were described above, the present invention can be applied favorably in cases of forming a large-screen imaging device by combining three or more imaging elements. In such a case, positioning is carried out so that the above-described relationship between the imaging elements holds between two imaging elements that are adjacent.

INDUSTRIAL APPLICABILITY

The radiation imaging element according to the present invention is favorable as a radiation imaging element for mammography, chest X-ray photography, etc., that requires a large screen.

The invention claimed is:

1. A radiation imaging device, having m×n (m being an integer no less than 2 and n being an integer no less than 1) radiation imaging elements arrayed on a base, each radiation imaging element being formed by depositing a scintillator on a photodetecting surface of a solid-state imaging element, the solid-state imaging element having a photodetecting portion formed by arraying pixels in two dimensions, the scintillator emitting light including light of a wavelength to which the solid-state imaging element has sensitivity upon incidence of radiation, the scintillator covered with a protective film, wherein with any two adjacently positioned radiation imaging elements, a surface fixed to the base of one of the radiation imaging elements protrudes more in a radiation incident direction than a radiation incident surface of the other radiation imaging element, wherein the two radiation imaging elements are juxtaposed to each other in a state such that the photodetecting portion of the radiation imaging element positioned at the back as viewed from the radiation incident direction is not blocked by the radiation imaging element positioned at the front, wherein the photodetecting portion of the radiation imaging element positioned at the front as viewed from the radiation incident direction spreads to an edge at the side of the other radiation imaging element and has the scintillator formed at substantially the same thickness from a central portion of the photodetecting portion to the edge, and wherein with the any two adjacently positioned radiation imaging elements, an end of the radiation imaging element positioned at the back as viewed from the radiation incident direction is blocked by the radiation of the element positioned at the front, each of the scintillator and photodetecting portion of the radiation imaging element positioned at the back as viewed from the radiation incident direction has an outwardly extending end most closely located toward the blocked end of the radiation imaging element positioned at the back, and the outwardly extending end of the scintillator of the radiation imaging element positioned at the back is located more closely to the blocked end of the radiation imaging element positioned at the back than is the outwardly extending end of the photodetecting portion of the radiation imaging element positioned at the back, and wherein the solid-state imaging element is a MOS type image sensor formed on a semiconductor substrate.

2. The radiation imaging device according to claim 1, wherein with the any two adjacently positioned radiation imaging elements, an end of the imaging element positioned at the back as viewed from the radiation incident direction and an end of the imaging element positioned at the front as viewed from the radiation incident direction are positioned so that the ends overlap.

3. A radiation imaging device according to claim 1, wherein the base comprises a fixed base and a wiring substrate disposed on the fixed base, and wherein a plurality of penetrating holes are formed in the wiring substrate.

4. A radiation imaging device according to claim 1, wherein the outwardly extending end of the scintillator of the radiation imaging element positioned at the back is located between the radiation imaging element positioned at the front and a semiconductor substrate of the radiation imaging element positioned at the back.

* * * * *